United States Patent [19]
Monnard

[11] Patent Number: 5,995,524
[45] Date of Patent: Nov. 30, 1999

[54] REAL-TIME DYNAMIC CHIRP MEASUREMENTS OF OPTICAL SIGNAL

[75] Inventor: Rene Henri Monnard, Old Bridge, N.J.

[73] Assignee: Lucent Technologies Inc., Murray Hill, N.J.

[21] Appl. No.: 09/170,856

[22] Filed: Oct. 13, 1998

[51] Int. Cl.$^6$ .................................................. H01S 3/10
[52] U.S. Cl. ........................... 372/28; 372/64; 372/38; 372/700; 372/31; 372/23
[58] Field of Search .................. 372/28, 6, 64, 372/38, 700, 29, 31, 23

[56] References Cited

U.S. PATENT DOCUMENTS

| | | | |
|---|---|---|---|
| 5,396,507 | 3/1995 | Kaminow et al. | ........................ 372/64 |
| 5,524,014 | 6/1996 | Kaminow et al. | ........................ 372/28 |

OTHER PUBLICATIONS

C. Dragone, "An N × N Optical Multiplexer Using a Planar Arrangement of Two Star Couplers," *IEEE Photon. Technol. Lett.*, vol. 3, No. 9, pp. 812–815, 1991.

R. A. Linke, "Modulation Induced Transient Chirping in Single Frequency Lasers," *IEEE J. Quantum Electron.*, vol. QE–21, No. 6, pp. 593–597, 1985.

N. S. Bergano, "Wavelength Discriminator Method for Measuring Dynamic Chirp in DFB Lasers," *Electron. Lett.*, vol. 24, No. 20, pp. 1296–1297, 1988.

R. A. Saunders, J. P. King and I. Hardcastle, "Wideband chirp measurement technique for high bit rate sources," *Electron. Lett.*, vol. 30, No. 16, pp. 1336–1337, 1994.

*Primary Examiner*—Leon Scott, Jr.

[57] ABSTRACT

A method of and apparatus for measuring chirp passes an input modulated optical signal through a Waveguide Grating Router (WGR) and processes the signals from adjacent WGR output ports in an oscilloscope, to obtain the real-time dynamic chirp measurements of the modulated optical signal.

12 Claims, 5 Drawing Sheets

REAL-TIME DYNAMIC CHIRP MEASUREMENTS OF OPTICAL SIGNAL

GOVERMENT CONTRACT

This invention was made with government support. The government has certain rights in this invention.

TECHNICAL FIELD OF THE INVENTION

This invention relates to the measurements of modulated optical signals and, more particularly, to a method of and apparatus for the real-time dynamic chirp measurements of modulated optical signals.

BACKGROUND OF THE INVENTION

The pattern-dependent chirp characteristics of an intensity modulated optical source significantly impact its performance in long-haul lightwave systems. Externally modulated lasers (EML) are routinely tested in the factory to have less than 1 Å wavelength excursion. Conventional time resolved chirp measurements techniques typically used either an optical filter (monochromator) or frequency discriminator (Fabry-Perot, Mach-Zehnder interferometer). Time resolved chirp measurement technique using an optical filter is described in the article by R. A. Linke, "Modulation Induced Transient Chirping in Single Frequency Lasers," *IEEE J. Quantum Electron.,* vol. QE-21, no. 6, pp. 593–597, 1985. Time resolved chirp measurement technique using a frequency is described in the articles by N. S. Bergano, "Wavelength Discriminator Method for Measuring Dynamic Chirp in DFB Lasers," *Electron. Lett.,* vol. 24, no 20, pp.1296–1297, 1988 and R. A. Saunders, J. P. King and I. Hardcastle, "Wideband chirp measurement technique for high bit rate sources," *Electron. Lett.,* vol. 30, no 16, pp.1336–1337, 1994. The first technique, referred hereafter as the classical method, scans the optical filter around the source wavelength and several traces are recorded in order to calculate the chirp. The second technique calculates the chirp from measurements at two or three settings of the frequency discriminator.

While such prior art measurement techniques have been successful they need to acquire several traces for different optical filter positions and require post-processing of the traces to calculate the chirp characteristic.

SUMMARY OF THE INVENTION

In accordance with the present invention, I have developed a method and apparatus for measuring chirp which does not require the moving of any of the optical filters or frequency discriminators. My technique involves passing a modulated input optical signal through a Waveguide Grating Router (WGR) and processing the signals from adjacent WGR output ports in a comparison means, e.g., an oscilloscope, to obtain the real-time dynamic chirp measurements of the modulated input optical signal.

More particularly, my invention comprises an apparatus for measuring real-time dynamic chirp measurements of an inputted modulated optical signal comprising a Waveguide Grating Router (WGR) for receiving the inputted modulated optical signal and for outputting an optical signal at two output ports of the WGR; an optical detector for detecting the optical signal from each of the two output ports to produce an electrical signal from each optical signal; a delay means for providing a relative delay between the two electrical signals to compensate for the differential optical delay of the optical signals from the two output ports; and a comparison means for generating a difference signal between the two electrical signals indicative of the real-time dynamic chirp of the inputted modulated optical signal.

My method of measuring real-time dynamic chirp of a modulated optical signal comprises the steps of: (1) receiving the modulated optical signal at a Waveguide Grating Router (WGR) and outputting a frequency discriminated optical signal at two output ports of the WGR; (2) detecting the frequency discriminated optical signal from each of the two output ports to produce an electrical signal from each optical signal; (3) providing a relative delay between the two electrical signals to compensate for the differential optical delay of the WGR on the two output ports; and (4) measuring a difference signal between the two electrical signals indicative of the real-time dynamic chirp of the modulated optical signal.

According to other features, the delay unit can be an optical or electrical delay unit and the comparison means can be an oscilloscope or a volt meter. The modulation of the optical signal can utilize intensity, wavelength or phase modulation types

DETAILED DESCRIPTION

In the following description, each item or graph of each figure has a reference designation associated therewith, the first number of which refers to the figure in which that item is first described (e.g., 101 is first described in FIG. 1).

My new technique uses a waveguide grating router (WGR) as a frequency discriminator that measures the time-resolved chirp in real time. Illustratively, the WGR can be of the type described by C. Dragone, "An N×N Optical Multiplexer Using a Planar Arrangement of Two Star Couplers," *IEEE Photon. Technol Left.,* vol. 3, no. 9, pp. 812–815, 1991.

Figure 1:
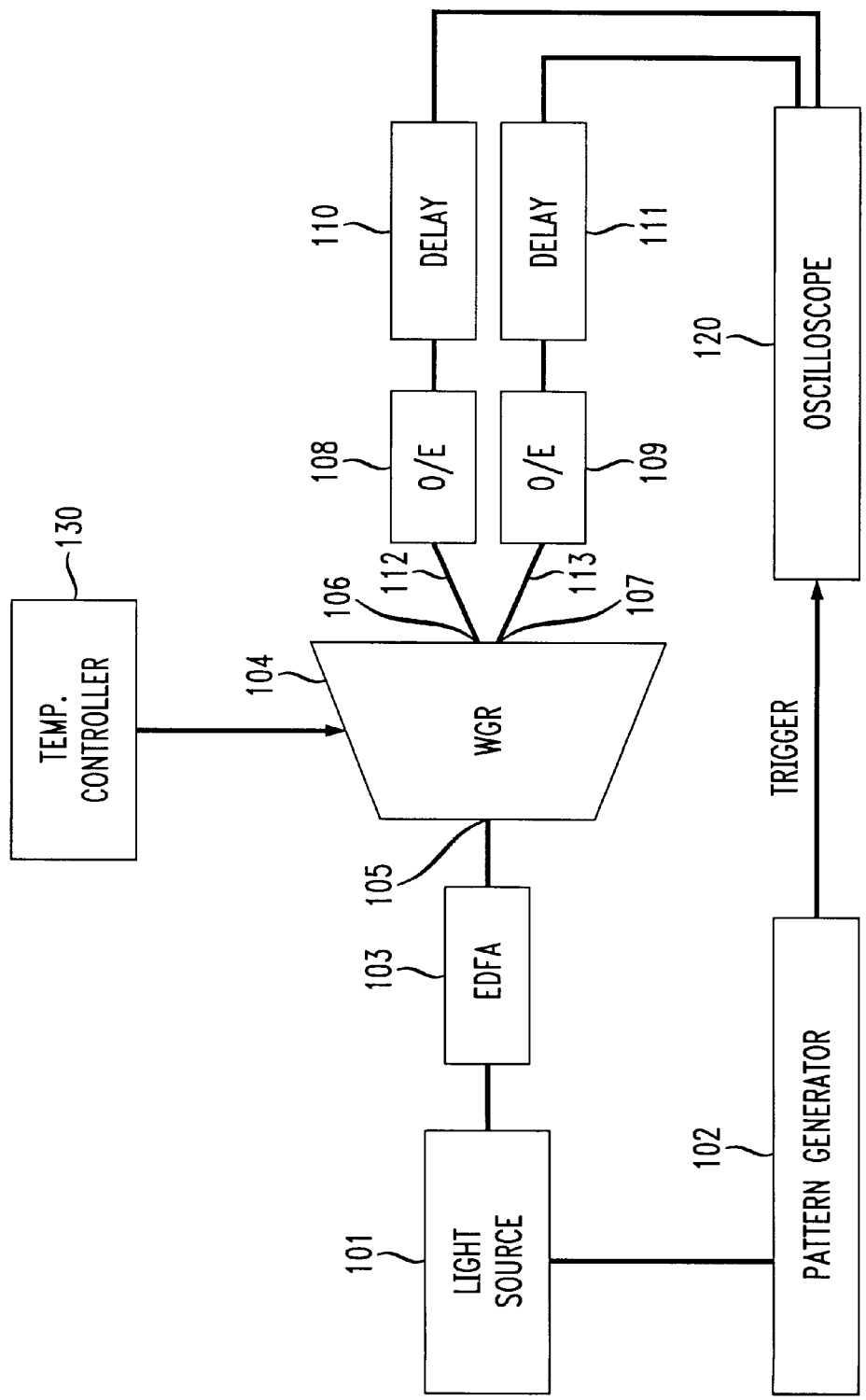
FIG. 1 shows an illustrative block diagram of an arrangement for enabling the real-time dynamic chirp measurements of modulated optical signals in accordance with the present invention.

With reference to FIG. 1 there is shown an illustrative block diagram of an arrangement for enabling the real-time dynamic chirp measurements of modulated optical signals in accordance with the present invention.

Figure 4:
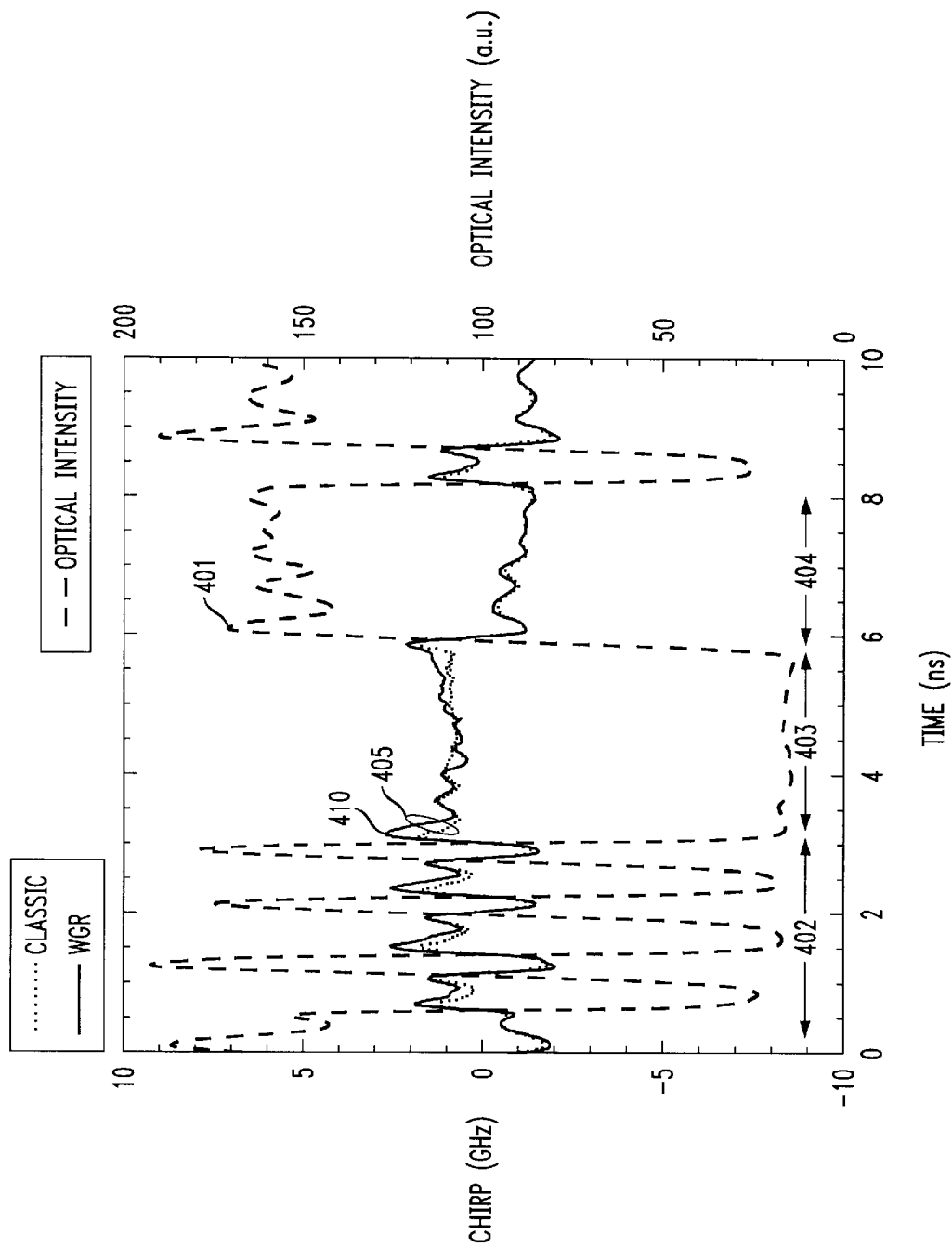
FIG. 4 shows an illustrative graph of the optical intensity waveform (large dash line) and time resolved chirp measurements of an Externally Modulated Laser (EML) for a 2.5 Gb/s Non-Return-to-Zero (NRZ) pattern. The solid line represents the chirp measured with the WGR and the small dash line is chirp measured with the monochromator technique (classic)

The optical source 101, illustratively an Externally Modulated Laser (EML), is intensity-modulated with a 2.5 Gb/s, $2^7$-1 length pseudo-random Non-Return-to-Zero (NRZ) pattern 102. The optical signal is amplified with a erbium doped fiber amplifier (EDFA) 103 before entering the WGR 104 which is temperature tuned, using temperature controller 130. The WGR 104 is arranged to have about the same optical power coming out of the two adjacent output ports 106 and 107. Two fast (15 GHz) PIN photodiodes, 108 and 109, are used as optical/electrical converters or receivers. The delay lines, 110 and 111, are added in order to compensate for fiber length differences from the WGR 104 to the receivers 108 and 109. The electrical signal traces acquired from each receiver are processed in a fast sampling oscilloscope 120 to directly generate a new trace (410 or WGR of FIG. 4), the real-time chirp of the modulated laser signal from 101. Using the arrangement of FIG. 1 and the Gaussian WGR characteristics of FIG. 2, the time-resolved chirp measurements 410 of FIG. 4 are obtained.

Figure 2:
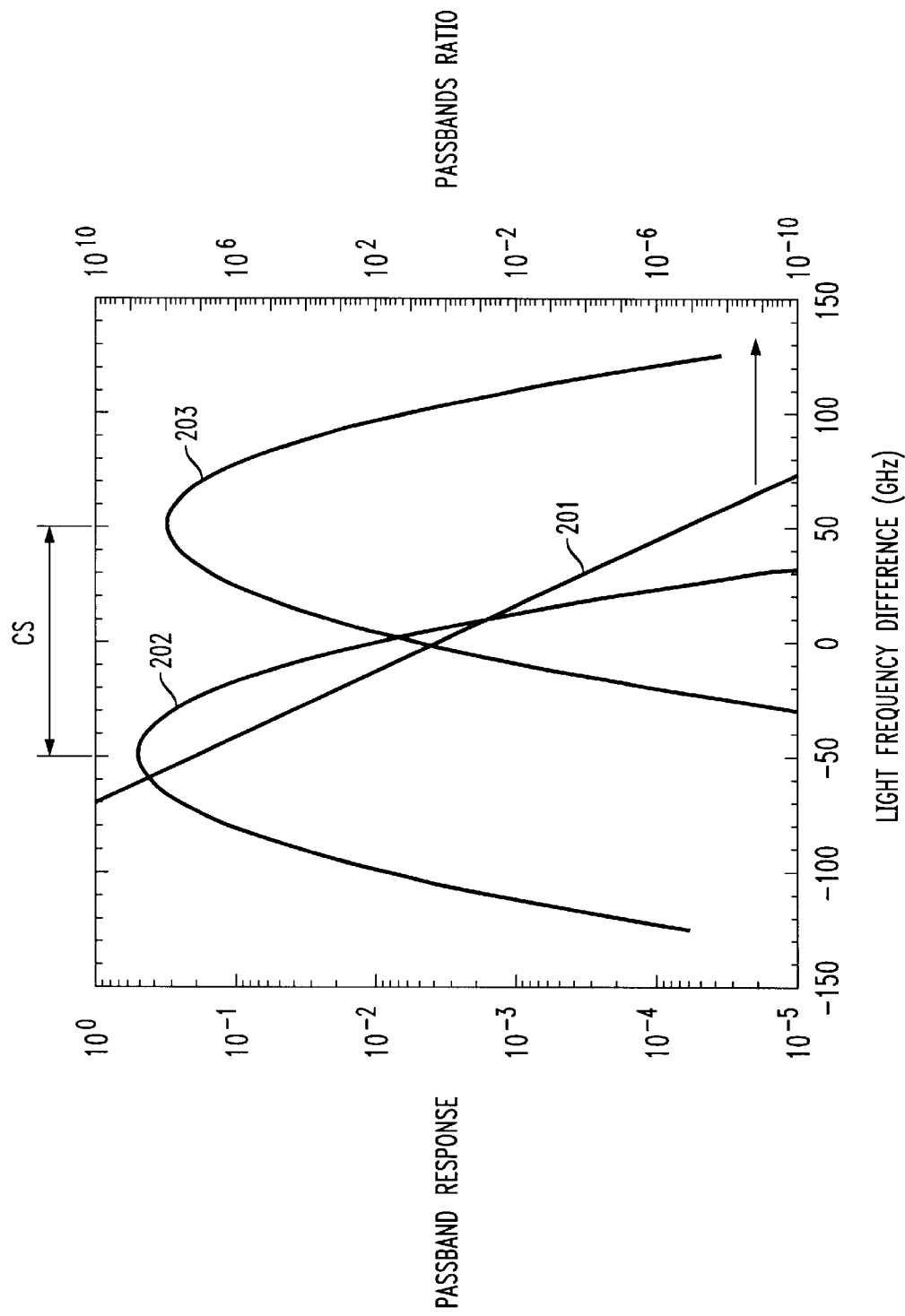
FIG. 2 shows an illustrative graph of two adjacent Waveguide Grating Router (WGR) port output responses and their ratio.

FIG. 2 shows illustrative graphs 201 of the passband responses of two adjacent Waveguide Grating Router (WGR) output ports responses, 202 and 203, and their ratio, 201, as a function of light frequency difference, in GHz. The "Dragone" WGR has a peaked passbands, e.g. 202 and 203, that can be approximated as a Gaussian. The curves 202 and 203 are the logarithm of the passband response of a signal entering the input port (105 of FIG. 1) and exiting two adjacent ports (106 and 107 of FIG. 1) of WGR 104 versus the signal frequency. The straight line 201 represents the logarithm of the passband intensity ratio of the output 202 (of port 106) to the output 203 (of port 107) for different wavelengths within the range ±150 Giga Hertz (GHz) of the wavelength of laser 101. Thus, FIG. 2 provides accurate frequency discrimination based on the ratio of the passband signals received from WGR. Because the range of frequency discrimination encompasses the range of laser frequency (wavelength) variations with laser intensity changes, an accurate real-time chirp measurement can be made using oscilloscope 120.

Figure 3:
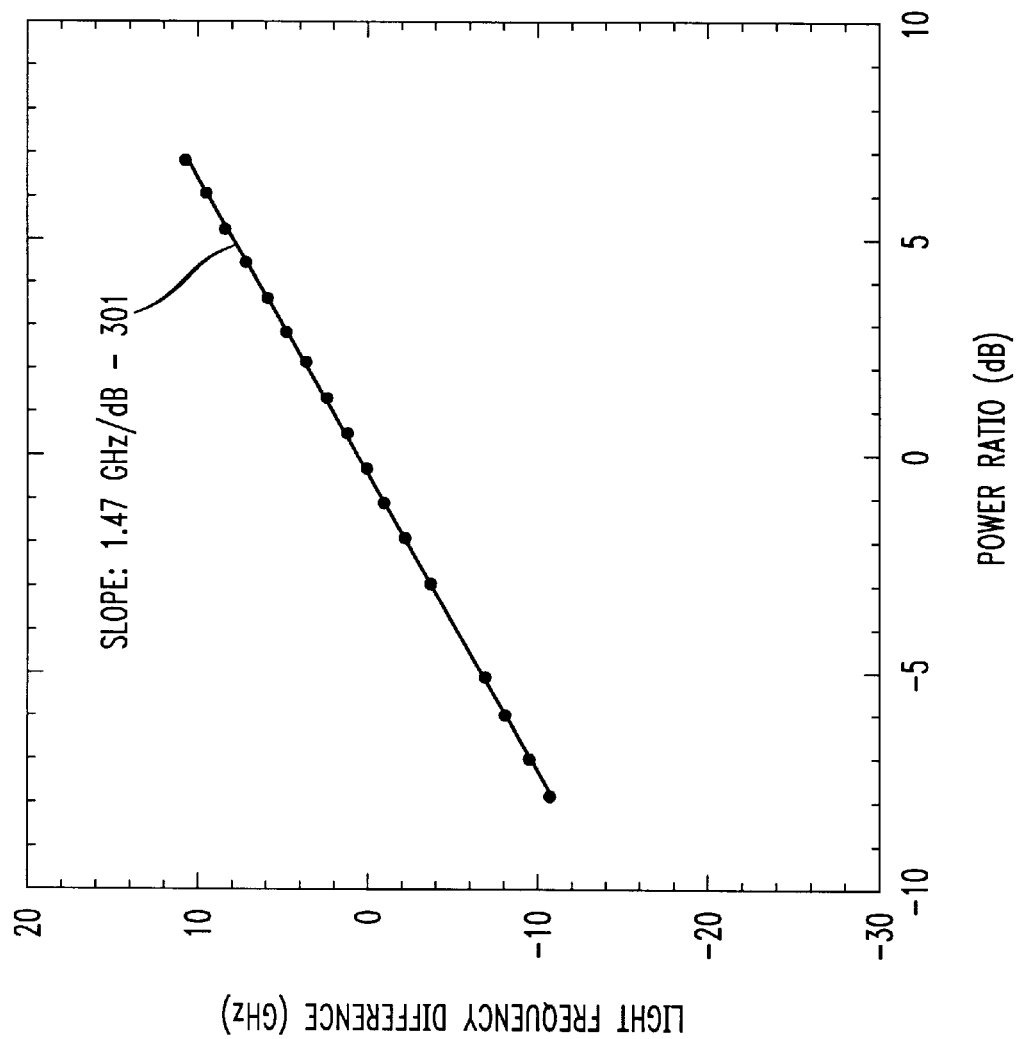
FIG. 3 shows an illustrative graph of the WGR frequency discriminator slope obtained by measuring the light frequencies differences for different optical power ratios of two adjacent output ports.

FIG. 3 shows an illustrative graph of the WGR frequency discriminator slope s, 301, obtained by measuring the optical power of two adjacent WGR output ports for different light frequencies. As shown, the slope s, which is the ratio of changes in the light frequency differences (in GHz) with variations in the output power ratio (in dB) from the two adjacent WGR output ports. It can be shown that if Cs is the channel spacing and w is the 1/e intensity Gaussian width, then the slope s, of the line shown in FIG. 3, is given by:

$$s = \frac{\ln(10)w^2}{20cs} \text{ [GHz/dB]}$$

When a 100 GHz channel spacing WGR is used, the measured frequency discriminator slope is about 1.47 GHz/dB (FIG. 3). Loss differences between the two WGR outputs, 202 and 203, will not affect this slope s, but will shift the absolute wavelength scale (i.e., the straight line 201 will move up or down).

FIG. 4 shows an illustrative waveform of the optical intensity waveform (large dash line 401) and time resolved chirp measurements (solid line 410 of FIG. 4) of a 1550 nm EML 101 which has been modulated by a 2.5 Gb/s NRZ pattern 102. As previously described, the chirp waveform 410 is derived by oscilloscope 120 by processing the electrical signal converted from each of the passband signals 202 and 203 from WGR 104. The oscilloscope determines the ratio of these electrical signals and determines therefrom a laser frequency difference signal (waveform 201 of FIG. 2). Using the signal pattern generator 102, which varies with time, as the x axis signal and the laser frequency difference signal as the y axis signal, the oscilloscope 120 displays the real-time dynamic chirp signal 410 shown in FIG. 4.

Note that the optical intensity waveform 401 of EML 101 varies as a function of the modulation. The faster 0 to 1 or 1 to 0 bit transition region is shown by 402 while the slower bit transitions, i.e., the longer "0" and "1" bit patterns, are shown by regions 403 and 404, respectively. The solid line 410 represents the chirp measured using the WGR and my real-time technique and the small dash line is chirp measured using the prior art monochromator technique (classic). The chirp value is meaningful only when there is significant optical intensity (i.e., above 20 percent of optical intensity on FIG. 4). The two techniques give very close results for long "1" s pattern (i.e., see region 404 on FIG. 4); the difference at the falling edges (405 on FIG. 4) may result from dispersion in the monochromator in the classical method.

Figure 5:
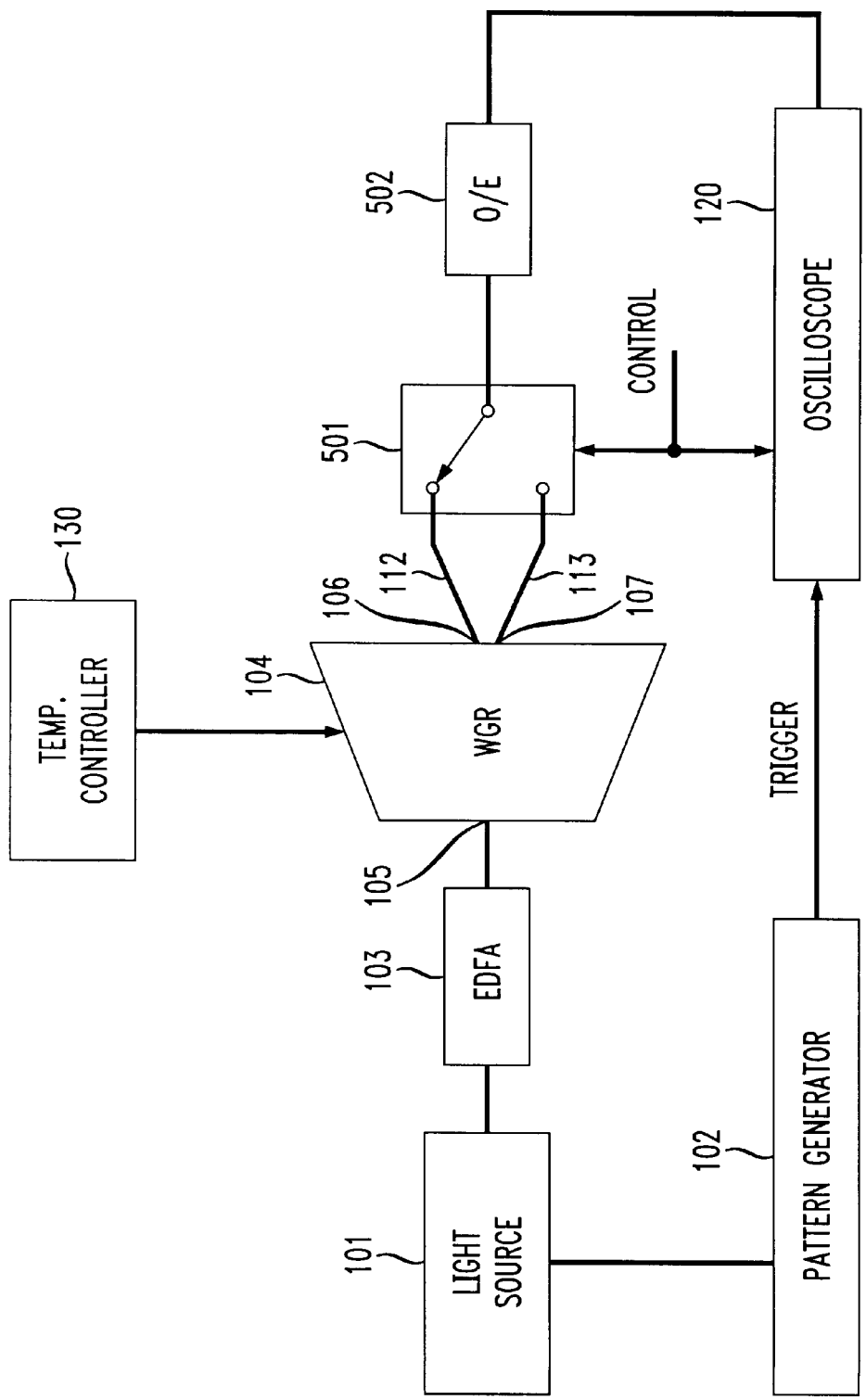
FIG. 5 shows, in accordance with the present invention, an improved arrangement for enabling static chirp measurements of modulated optical signals.

FIG. 5 shows, in accordance with the present invention, an improved arrangement for enabling dynamic (but not in real time) chirp measurements of optical signals. In FIG. 5 the two receivers 108 and 109 have been replaced with a single receiver 502 while the delay units 110 and 111 have been removed. The delay is compensated for in the oscilloscope. A mechanical or electromechanical optical switch 501 switches, in response to a control signal, between the output ports 106 and 107 of WGR 104. The control signal is also used by the oscilloscope 120 to distinguish the different output signals. Because of the switching between output ports the arrangement of FIG. 5 cannot perform real-time chirp measurements of modulated input optical signals.

In a factory laser testing application, the light source 101 may be any of a plurality of lasers to be tested, each operating at a different frequency. Or the laser could be one having selectable wavelengths. In such a testing application, the WGR 104 would have a predetermined number of outputs (e.g., 8, 16, 24 etc.) and the optical switch 501 could selectively connect any of the predetermined number of outputs, one at a time, to the receiver, O/E 502, the two output ports being selected depending on the wavelength of the particular laser being tested. In this manner different wavelengths of a selectable wavelength laser or different wavelength of different lasers could be tested for chirp characteristics.

In conclusion, my new technique describes a method for using a WGR to measure time-resolved chirp in real time. The measured chirp of an EML using my technique obtains results which are very close to those obtained using a monochromator as an optical filter. This new technique can substantially decrease the time needed to characterize the chirp of optical sources at the factory and could also be used to rapidly diagnose and optimize source chirp in experimental systems.

What has been described is merely illustrative of the application of the principles of the present invention. Thus, for example with reference to FIG. 1, the electrical delay units 110 and 111 can be replaced with optical delay units that are placed between the WGR 104 and receivers 108 and 109, respectively. For calibration purposes, the oscilloscope 120 and O/E 502 can be replaced with an optical power meter. Moreover, the modulation of laser or light source 101 can utilize intensity, wavelength or phase modulation types. Thus, other arrangements and methods can be implemented by those skilled in the art without departing from the spirit and scope of the present invention.

What is claimed is:

1. Apparatus for measuring real-time dynamic chirp measurements of an input modulated optical signal comprising a Waveguide Grating Router (WGR) for receiving the input modulated optical signal and for outputting an optical signal at two different output ports of the WGR;

an optical detector for detecting the optical signal from each of the two output ports to produce an electrical signal from each wavelength signal;

delay means for providing a relative delay between the two electrical signals to compensate for the differential optical delay of the optical signals from the two output ports; and comparison means for generating a difference signal between the two electrical signals indicative of the real-time dynamic chirp of the input modulated optical signal.

2. The apparatus of claim 1 wherein the delay means is an optical delay apparatus located between the WGR and the optical detector.

3. The apparatus of claim 1 wherein the comparison means is an oscilloscope.

4. The apparatus of claim 1 wherein the optical signal is a modulated optical signal and wherein the comparison means is an oscilloscope which measures the time chirp of the input modulated optical signal.

5. The apparatus of claim 1 wherein the input modulated signal is modulated using a modulation type selected from a group including intensity, wavelength, and phase modulation.

6. A method of measuring real-time dynamic chirp of a modulated optical signal comprising the steps of:

receiving the modulated optical signal at a Waveguide Grating Router (WGR) and outputting an optical signal at two output ports of the WGR;

detecting the optical signal from each of the two output ports to produce an electrical signal from each optical signal;

providing a relative delay between the two electrical signals to compensate for the differential optical delay of the WGR on the two output ports; and measuring a difference signal between the two electrical signals indicative of the real-time dynamic chirp of the modulated optical signal.

7. Apparatus for measuring chirp measurements of a modulated optical signal comprising a Waveguide Grating Router (WGR) for receiving the modulated optical signal and for outputting an optical signal at two different wavelength output ports of the WGR;

a switch for selectively connecting, in response to a control signal, each of the two output ports to an optical detector one at a time;

the optical detector for detecting an optical signal from each of the two output ports to produce an electrical signal from each optical signal; and comparison means, responsive to the control signal, for generating a difference signal between the two electrical signals indicative of the chirp of the modulated optical signal.

8. The apparatus of claim 7 wherein the modulated optical signal has an optical wavelength produced by a laser chosen from a plurality of lasers, each operating at a different wavelength, the WGR has more than two output ports, and the switch selectively connects to two of said more than two output ports, one at a time, said two output ports being selected depending on the wavelength of the chosen laser.

9. The apparatus of claim 7 wherein the modulated optical signal has an optical wavelength produced by selecting one wavelength of a multiple wavelength selectable laser, the WGR has more than two output ports, and the switch selectively connects to two of said more than two output ports, one at a time, said two output ports being selected depending on the selected wavelength of the laser.

10. A method of measuring chirp of a modulated optical signal comprising the steps of:

receiving the modulated optical signal at a Waveguide Grating Router (WGR) and outputting an optical signal at each of two wavelength output ports of the WGR;

selectively switching, in response to a control signal, each of the two output ports to an optical detector one at a time;

detecting the optical signal from each of the two channels to produce an electrical signal from each optical signal; and generating and measuring, in response to the control signal, a difference signal between the two electrical signals indicative of the chirp of the modulated optical signal.

11. The method of claim 10 wherein the modulated optical signal has an optical wavelength produced by selecting one wavelength of a multiple wavelength selectable laser, the WGR has more than two output ports, and the selective switching step selects from two of said more than two output ports, one at a time, said two output ports being selected depending the selected wavelength of the laser.

12. The method of claim 10 wherein the modulated optical signal has an optical wavelength produced by a laser chosen from a plurality of lasers each operating at a different wavelength, the WGR has more than two output ports, and the selective switching step selects from two of said more than two output ports, one at a time, said two output ports being selected depending on the wavelength of the chosen laser.

* * * * *